US012665295B2

(12) United States Patent
Park et al.

(10) Patent No.: US 12,665,295 B2
(45) Date of Patent: Jun. 23, 2026

(54) ELECTRONIC DEVICE COMPRISING PLURALITY OF ANTENNAS AND METHOD FOR OPERATING SAME

(71) Applicant: SAMSUNG ELECTRONICS CO., LTD., Suwon-si (KR)

(72) Inventors: Daehee Park, Suwon-si (KR); Janghoon Han, Suwon-si (KR); Chonghwa Seo, Suwon-si (KR); Jongwon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 443 days.

(21) Appl. No.: 18/198,714

(22) Filed: May 17, 2023

(65) Prior Publication Data

US 2023/0291098 A1     Sep. 14, 2023

Related U.S. Application Data

(63) Continuation of application No. PCT/KR2021/016528, filed on Nov. 12, 2021.

(30) Foreign Application Priority Data

Nov. 20, 2020     (KR) ........................ 10-2020-0156850

(51) Int. Cl.
  *H01Q 1/24*      (2006.01)
  *H01Q 3/28*      (2006.01)
  *H03F 3/24*      (2006.01)
(52) U.S. Cl.
  CPC .............. *H01Q 3/28* (2013.01); *H01Q 1/243* (2013.01); *H03F 3/245* (2013.01); *H03F 2200/451* (2013.01)

(58) Field of Classification Search
  CPC   H01Q 3/28; H01Q 1/243; H01Q 1/52; H01Q 3/26; H03F 3/245; H03F 2200/451;
                                    (Continued)

(56) References Cited

U.S. PATENT DOCUMENTS

| | | | | |
|---|---|---|---|---|
| 5,576,660 A | * | 11/1996 | Pouysegur | ............ H03F 1/3241 |
| | | | | 330/53 |
| 6,522,293 B2 | | 2/2003 | Vail et al. | |

(Continued)

FOREIGN PATENT DOCUMENTS

| | | |
|---|---|---|
| CN | 111147100 A | 5/2020 |
| EP | 3 675 548 A1 | 7/2020 |

(Continued)

OTHER PUBLICATIONS

Communication issued Mar. 15, 2024 by the European Patent Office in European Patent Application No. 21895023.6.

(Continued)

*Primary Examiner* — Dimary S Lopez Cruz
*Assistant Examiner* — Bamidele A Immanuel
(74) *Attorney, Agent, or Firm* — Sughrue Mion, PLLC

(57)        ABSTRACT

A method performed by an electronic device, includes: generating a beamforming signal by using a first antenna and a second antenna; increasing a first input value of a first power amplifier and a second input value of a second power amplifier, based on performance of the beamforming signal being deteriorated; measuring a first output value of the first power amplifier based on the increased first input value and measuring a second output value of the second power amplifier based on the increased second input value; and determining, based on the measured first output value and the measured second output value, at least one of the first power amplifier or the second power amplifier is deteriorated in performance, and connecting a first attenuator or a (Continued)

second attenuator electrically to the deteriorated power amplifier.

18 Claims, 8 Drawing Sheets

(58) Field of Classification Search
CPC ......... H03F 2200/105; H03F 2200/211; H03F 2200/411; H03F 3/195; H03F 3/68; H03F 3/602; H03G 3/3042; H04B 1/0483; H04M 2201/34
See application file for complete search history.

(56) References Cited

U.S. PATENT DOCUMENTS

| | | | | |
|---|---|---|---|---|
| 7,113,748 | B2 * | 9/2006 | Shapira | H04B 7/10 |
| | | | | 455/562.1 |
| 8,615,204 | B2 | 12/2013 | Husted | |
| 8,761,834 | B2 * | 6/2014 | Luz | H04B 7/0689 |
| | | | | 455/562.1 |
| 8,774,737 | B2 | 7/2014 | Mori et al. | |
| 9,225,291 | B2 * | 12/2015 | Ahmed | H03F 3/68 |
| 9,374,051 | B2 * | 6/2016 | Ahmed | H03F 1/0288 |
| 9,673,846 | B2 | 6/2017 | Hageman et al. | |
| 10,651,902 | B2 * | 5/2020 | Guan | H04B 7/0634 |
| 11,197,169 | B2 | 12/2021 | Chang et al. | |
| 11,258,475 | B2 | 2/2022 | Lee et al. | |
| 11,424,539 | B2 | 8/2022 | Alpman et al. | |
| 11,664,831 | B2 | 5/2023 | Chen et al. | |
| 2002/0105463 | A1 | 8/2002 | Vail et al. | |
| 2003/0117324 | A1 * | 6/2003 | Iwai | H01Q 1/362 |
| | | | | 343/702 |
| 2006/0118625 | A1 * | 6/2006 | Sekita | G06F 1/1677 |
| | | | | 235/451 |
| 2009/0115530 | A1 * | 5/2009 | Bott | H03F 1/0288 |
| | | | | 330/295 |
| 2010/0069017 | A1 * | 3/2010 | Yamamoto | H01Q 9/16 |
| | | | | 343/702 |
| 2011/0235749 | A1 * | 9/2011 | Kenington | H04L 25/03343 |
| | | | | 375/296 |
| 2012/0270511 | A1 * | 10/2012 | Dakshinamurthy | |
| | | | | H03G 3/3042 |
| | | | | 455/115.1 |
| 2012/0299765 | A1 * | 11/2012 | Huang | H01Q 21/20 |
| | | | | 342/81 |
| 2012/0326781 | A1 | 12/2012 | Mori et al. | |
| 2013/0052964 | A1 | 2/2013 | Husted | |

| | | | | |
|---|---|---|---|---|
| 2015/0116039 | A1 * | 4/2015 | Ahmed | H03F 1/0233 |
| | | | | 330/295 |
| 2015/0256272 | A1 * | 9/2015 | Weissman | H03F 3/213 |
| | | | | 455/84 |
| 2016/0094187 | A1 * | 3/2016 | Staudinger | H03F 1/3247 |
| | | | | 330/295 |
| 2017/0070247 | A1 | 3/2017 | Hageman et al. | |
| 2017/0126181 | A1 * | 5/2017 | Embar | H03F 3/245 |
| 2018/0006359 | A1 * | 1/2018 | Wong | H01Q 9/0421 |
| 2018/0026586 | A1 * | 1/2018 | Carbone | H03F 1/3282 |
| | | | | 330/124 R |
| 2018/0262994 | A1 * | 9/2018 | Park | H04W 52/52 |
| 2020/0091608 | A1 | 3/2020 | Alpman et al. | |
| 2020/0186400 | A1 * | 6/2020 | Lee | H04B 1/0064 |
| 2020/0194904 | A1 * | 6/2020 | Huh | H01Q 21/065 |
| 2020/0267567 | A1 * | 8/2020 | Chang | H04W 24/10 |
| 2021/0044259 | A1 * | 2/2021 | Zheng | H04B 1/0475 |
| 2021/0203368 | A1 * | 7/2021 | Chen | H04B 1/0064 |
| 2021/0336489 | A1 * | 10/2021 | Lee | H02J 50/40 |
| 2021/0344783 | A1 * | 11/2021 | Jeong | G06F 1/1616 |
| 2022/0158588 | A1 * | 5/2022 | Yeo | H03K 17/687 |
| 2022/0312348 | A1 * | 9/2022 | Drogi | H04B 7/0602 |
| 2022/0369234 | A1 * | 11/2022 | Jeon | H04W 52/367 |
| 2022/0384956 | A1 | 12/2022 | Alpman et al. | |

FOREIGN PATENT DOCUMENTS

| | | | | | |
|---|---|---|---|---|---|
| JP | 2000-183762 | A | | 6/2000 | |
| JP | 2005-260339 | A | | 9/2005 | |
| JP | 2020-507230 | A | | 3/2020 | |
| KR | 10-2014-0053384 | A | | 5/2014 | |
| KR | 10-2017-0003837 | A | | 1/2017 | |
| KR | 20170003837 | A | * | 1/2017 | H04B 7/0682 |
| KR | 10-2018-0041470 | A | | 4/2018 | |
| KR | 101925923 | B1 | * | 2/2019 | H02J 50/20 |
| KR | 10-2019-0031839 | A | | 3/2019 | |
| KR | 10-2019-0075431 | A | | 7/2019 | |
| KR | 10-2020-0071491 | A | | 6/2020 | |
| KR | 10-2021-0081972 | A | | 7/2021 | |

OTHER PUBLICATIONS

International Search Report (PCT/ISA/210) issued by the International Searching Authority on Mar. 3, 2022 in International Application No. PCT/KR2021/016528.

Written Opinion (PCT/ISA/237) issued by the International Searching Authority on Mar. 3, 2022 in International Application No. PCT/KR2021/016528.

\* cited by examiner

101

| PROCESSOR | 200 |
| FIRST ANTENNA | 210 |
| SECOND ANTENNA | 215 |
| FIRST POWER AMPLIFIER | 220 |
| SECOND POWER AMPLIFIER | 225 |
| THIRD POWER AMPLIFIER | 230 |
| FIRST ATTENUATOR | 240 |
| SECOND ATTENUATOR | 245 |
| MEMORY | 250 |

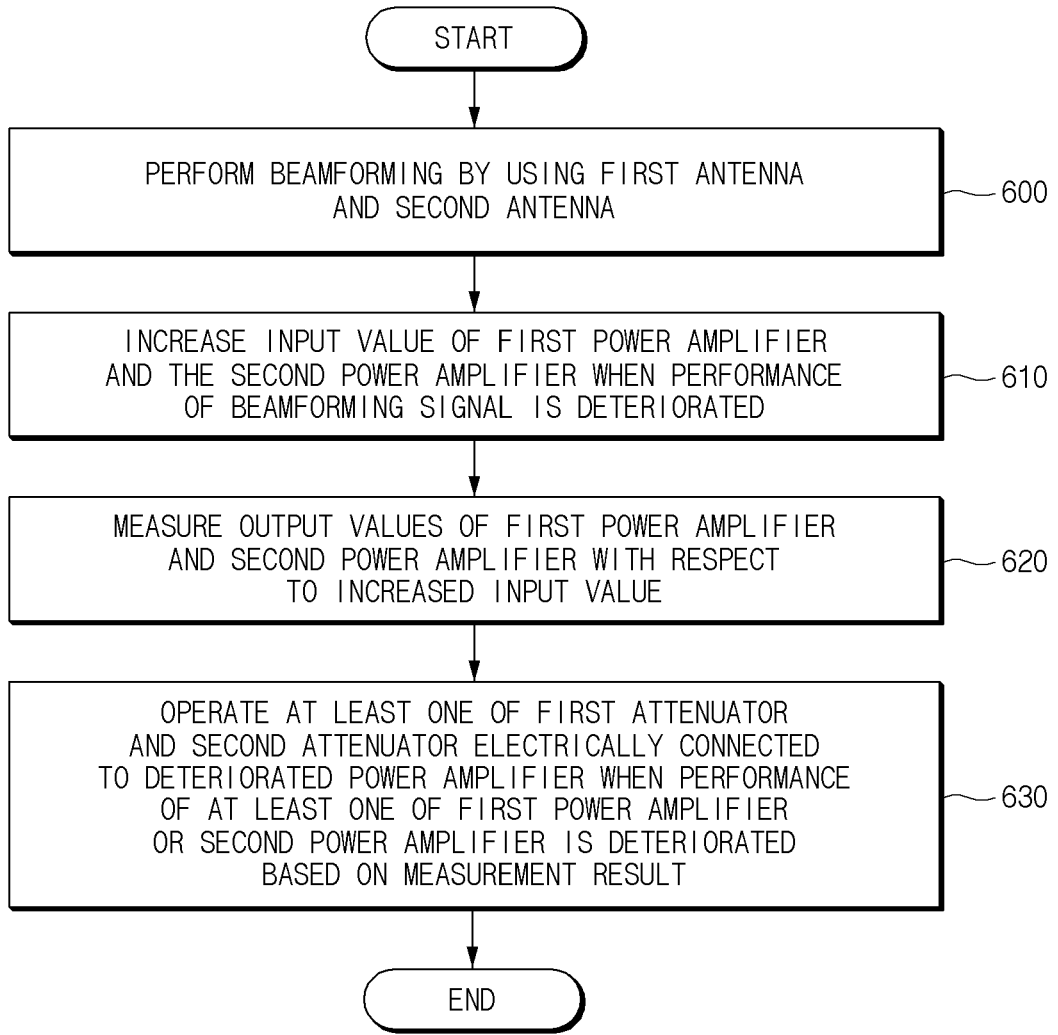

START

PERFORM BEAMFORMING BY USING FIRST ANTENNA
AND SECOND ANTENNA    ~600

INCREASE INPUT VALUE OF FIRST POWER AMPLIFIER
AND THE SECOND POWER AMPLIFIER WHEN PERFORMANCE
OF BEAMFORMING SIGNAL IS DETERIORATED    ~610

MEASURE OUTPUT VALUES OF FIRST POWER AMPLIFIER
AND SECOND POWER AMPLIFIER WITH RESPECT
TO INCREASED INPUT VALUE    ~620

OPERATE AT LEAST ONE OF FIRST ATTENUATOR
AND SECOND ATTENUATOR ELECTRICALLY CONNECTED
TO DETERIORATED POWER AMPLIFIER WHEN PERFORMANCE
OF AT LEAST ONE OF FIRST POWER AMPLIFIER
OR SECOND POWER AMPLIFIER IS DETERIORATED
BASED ON MEASUREMENT RESULT    ~630

END

FIG.6

ELECTRONIC DEVICE COMPRISING PLURALITY OF ANTENNAS AND METHOD FOR OPERATING SAME

CROSS-REFERENCE TO RELATED APPLICATIONS

This application is a by-pass continuation application of International Application No. PCT/KR2021/016528, filed on Nov. 12, 2021, which is based on and claims priority to Korean Patent Application No. 10-2020-0156850, filed on Nov. 20, 2020, in the Korean Intellectual Property Office, the disclosures of which are incorporated by reference herein their entireties.

BACKGROUND

1. Field

The disclosure relates to an electronic device including a plurality of antennas and a method performed by the electronic device.

2. Description of Related Art

An electronic device that communicates using a high frequency band signal (e.g., mmWave communication) may include a plurality of antennas. The electronic device may perform beamforming (e.g., generate a beamforming signal) by using a plurality of antennas to secure signal strength and reach. The electronic device may transmit the signal amplified by using the power amplifier to the antenna.

A plurality of power amplifiers may be electrically connected to a plurality of antennas, respectively. An electronic device may apply the same input value to the plurality of power amplifiers in order to maintain transmission performance by effectively controlling the plurality of power amplifiers. Meanwhile, while the electronic device performs data communication, amplification performance may deteriorate due to heat generated by a power amplifier.

In this case, the equivalent isotropic radiated power (EIRP) of a signal transmitted by the electronic device using a plurality of antennas may be deteriorated. The electronic device may increase an input value commonly applied to a plurality of power amplifiers in order to compensate for EIRP deterioration of the transmission signal. Because the power amplifiers have different performance and temperature characteristics due to temperature and sample deviation, at least one of a plurality of power amplifiers may operate in a saturation region when the common input value of the plurality of power amplifiers increases. In this case, an error vector magnitude (EVM) of a transmission signal of a power amplifier operating in a saturation region may increase. The increased EVM of some power amplifiers may significantly contribute to the degradation of EVM performance of all power amplifiers.

As described above, when the electronic device increases the common input value of a plurality of power amplifiers to compensate for the degraded EIRP, the total EVM may increase. Accordingly, in an electronic device including a plurality of antennas, EIRP and EVM may be in a trade-off relationship.

SUMMARY

According to an aspect of the disclosure, an electronic device includes: a first antenna; a second antenna; a first power amplifier electrically connected to the first antenna; a second power amplifier electrically connected to the second antenna; a first attenuator electrically connected to the first antenna; a second attenuator electrically connected to the second antenna; and a processor operatively connected to the first attenuator and the second attenuator, wherein the processor is configured to: generate a beamforming signal by using the first antenna and the second antenna, increase a first input value of the first power amplifier and a second input value of the second power amplifier, based on performance of the beamforming signal being deteriorated, measure a first output value of the first power amplifier with respect to the increased first input value and measure a second output value of the second power amplifier with respect to the increased second input value, determine whether the first power amplifier has deteriorated performance based on the measured first output value, determine whether the second power amplifier has deteriorated performance based on the measured second output value, based on determining that the first power amplifier has the deteriorated performance, electrically connect the first attenuator to the first power amplifier, and based on determining that the second power amplifier has the deteriorated performance, electrically connect the second attenuator to the second power amplifier.

The processor may be further configured to check the performance of the beamforming signal based on an equivalent isotropic radiated power (EIRP) value.

The electronic device may further include a third power amplifier positioned in front of the first power amplifier and the second power amplifier in a signal receiving path, and the processor may be further configured to apply a third output value of the third power amplifier as the first input value of the first power amplifier and the second input value of the second power amplifier.

The processor may be further configured to: compare the first output value of the first power amplifier with an output value in a linear region of the increased first input value of the first power amplifier; and determine that the performance of the first power amplifier is deteriorated based on a difference between the first output value of the first power amplifier and the output value in the linear region for the increased first input value of the first power amplifier being equal to or greater than a first threshold value.

The first attenuator may include a first variable resistance and the second attenuator includes a second variable resistance.

The processor may be further configured to, based on determining that the first power amplifier has the deteriorated performance, reduce the first input value of the first power amplifier by operating the first attenuator, and based on determining that the second power amplifier has the deteriorated performance, reduce the second input value of the second power amplifier by operating the second attenuator.

The first power amplifier and the second power amplifier may have different performances at a specific temperature.

The electronic device may further include: a foldable housing that is foldable along at least one axis; and at least one sensor, and the processor may be further configured to: detect folding or unfolding of the foldable housing of the electronic device by using the at least one sensor, and increase the first input value of the first power amplifier and the second input value of the second power amplifier based on performance of the beamforming signal being deteriorated in a folded state or an unfolded state.

The electronic device may further include: a rollable housing having at least one surface extendable; and at least one sensor, and the processor may be further configured to: detect extension or contraction of the rollable housing of the electronic device by using the at least one sensor, and increase the first input value of the first power amplifier and the second input value of the second power amplifier based on performance of the beamforming signal being deteriorated in a contracted state or an extended state.

According to an aspect of the disclosure, a method performed by an electronic device, includes: generating a beamforming signal by using a first antenna and a second antenna; increasing a first input value of a first power amplifier and a second input value of a second power amplifier, based on performance the beamforming signal being deteriorated; measuring a first output value of the first power amplifier with respect to the increased first input value and measuring a second output value of the second power amplifier with respect to the increased second input value; determining whether the first power amplifier has deteriorated performance based on the measured first output value; determining whether the second power amplifier has deteriorated performance based on the measured second output value; based on determining that the first power amplifier has the deteriorated performance, electrically connecting a first attenuator to the first power amplifier; and based on determining that the second power amplifier has the deteriorated performance, electrically connecting a second attenuator to the second power amplifier.

The method may further include checking the performance of the beamforming signal based on an equivalent isotropic radiated power (EIRP) value.

The method may further include applying a third output value of a third power amplifier as the first input value of the first power amplifier and the second input value of the second power amplifier, and the third power amplifier is positioned in front of the first power amplifier and the second power amplifier in a signal receiving path.

The method may further include: comparing the first output value of the first power amplifier with an output value in a linear region of the increased first input value of the first power amplifier; and determining that the performance of the first power amplifier is deteriorated based on a difference between the first output value of the first power amplifier and the output value in the linear region for the increased first input value of the first power amplifier being equal to or greater than a first threshold value.

The first attenuator may include a first variable resistance and the second attenuator may include a second variable resistance.

The method may further include: based on determining that the first power amplifier has the deteriorated performance, reducing the first input value of the first power amplifier by operating the first attenuator, and based on determining that the second power amplifier has the deteriorated performance, reducing the second input value of the second power amplifier by operating the second attenuator.

According to one or more embodiments of the disclosure, the electronic device may compensate for EIRP deterioration and reduce the resulting increase in EVM by individually controlling the power amplifier using the attenuator. In addition, various effects that are directly or indirectly understood through the present disclosure may be provided.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 6 is a flowchart illustrating an operation of an electronic device according to an embodiment;

With regard to description of drawings, the same or similar elements may be marked by the same or similar reference numerals.

DETAILED DESCRIPTION

Figure 1:
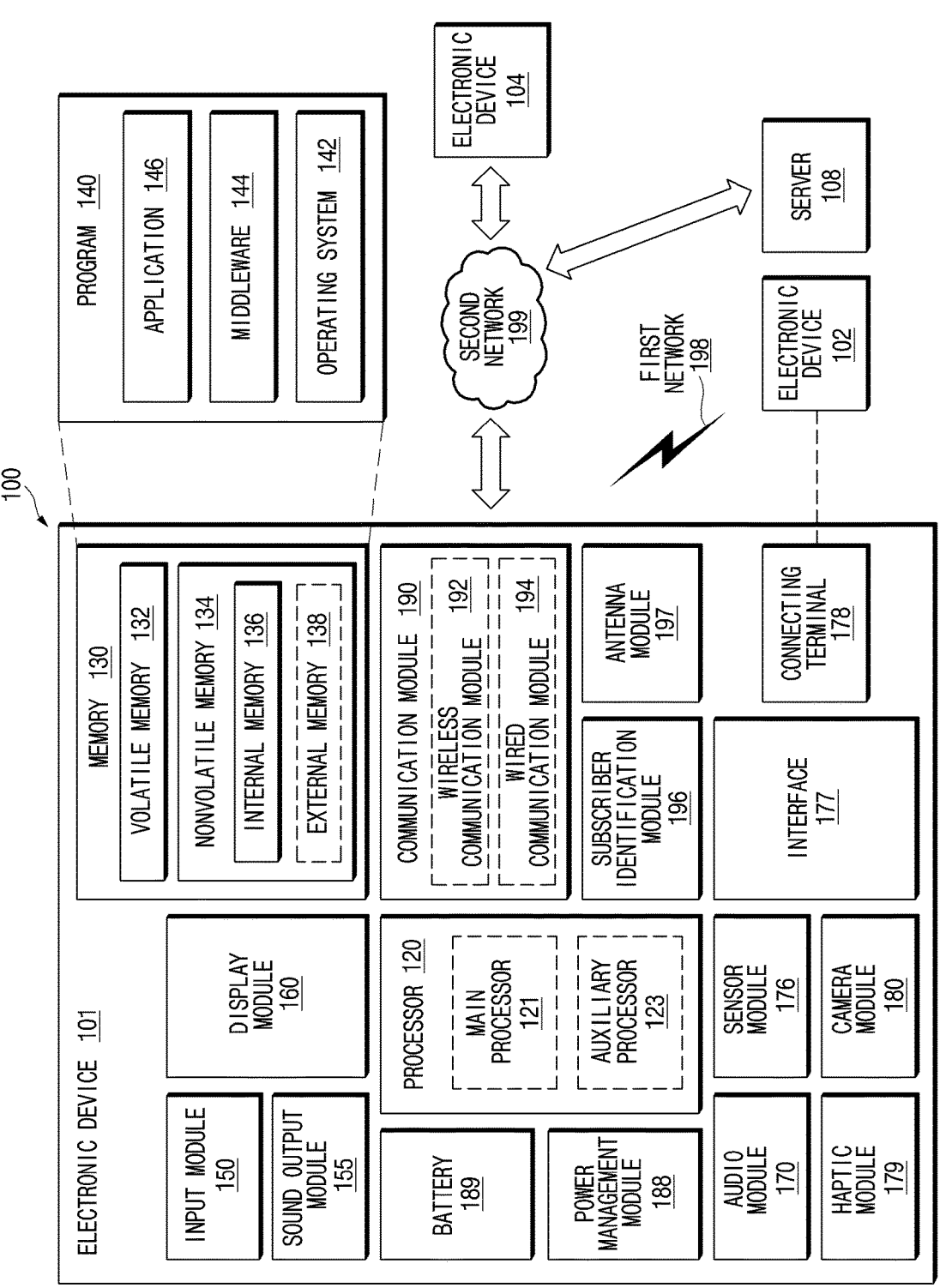
FIG. 1 is a block diagram illustrating an electronic device in a network environment according to one or more embodiments.

FIG. 1 is a block diagram illustrating an electronic device 101 in a network environment 100 according to one or more embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module(SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on ahigh-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of Ims or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to one or more embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to one or more embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that one or more embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with one or more embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

One or more embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to one or more embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one or more embodiments, each component (e.g., a module or a program) of the above-described components may include a single entity or multiple entities, and some of the multiple entities may be separately disposed in different components. According to one or more embodiments, one or more of the above-described components may be omitted, or one or more other components may be added. Alternatively or additionally, a plurality of components (e.g., modules or programs) may be integrated into a single component. In such a case, according to one or more embodiments, the integrated component may still perform one or more functions of each of the plurality of components in the same or similar manner as they are performed by a corresponding one of the plurality of components before the integration. According to one or more embodiments, operations performed by the module, the program, or another component may be carried out sequentially, in parallel, repeatedly, or heuristically, or one or more of the operations may be executed in a different order or omitted, or one or more other operations may be added.

Figure 2:
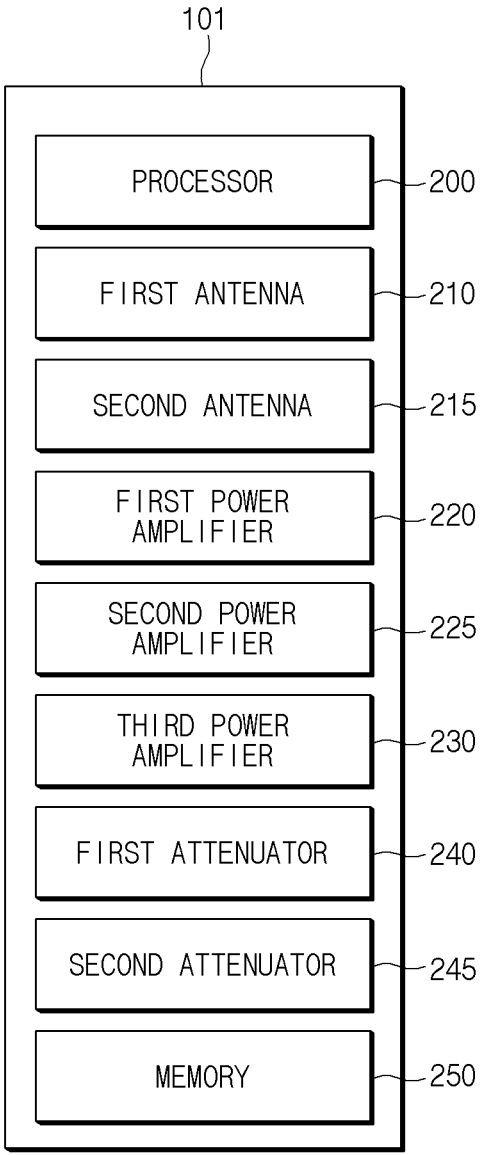
FIG. 2 is a block diagram illustrating the configuration of an electronic device.

FIG. 2 is a block diagram illustrating the configuration of an electronic device.

According to an embodiment, an electronic device (e.g., 101 in FIG. 1) may include a processor 200, a first antenna 210, a second antenna 215, a first power amplifier 220, a second power amplifier 225, a third power amplifier 230, a first attenuator 240, a second attenuator 245, and/or a memory 250. The configuration of the electronic device 101 shown in FIG. 2 is exemplary, and, for example, the electronic device 101 may further include a battery (e.g., 189 in FIG. 1).

According to one or more embodiments, the processor 200 may include a processor included in the processor 120 and/or the communication module 190 of FIG. 1. For example, the processor 200 may include a communication processor included in the communication module 190 of FIG. 1.

For example, the processor 200 may execute software (e.g., the program 140 of FIG. 1) to control at least one other component (e.g., hardware or software component), and may perform various data processing or operations.

The first antenna 210 (e.g., the antenna module 197 of FIG. 1) and the second antenna 215 (e.g., the antenna module 197 of FIG. 1) may transmit signals or power to an outside (e.g., an external electronic device) or receive from the outside. According to an embodiment, the first antenna 210 and the second antenna 215 may include an antenna including a radiator formed of a conductor or a conductive pattern formed on a substrate (e.g., PCB).

The first power amplifier 220, the second power amplifier 225 and the third power amplifier 230 may amplify and output received input signals. The third power amplifier 230 may be arranged before the first power amplifier 220 and the second power amplifier 225. In other words, the third power amplifier 230 is positioned in front of the first power amplifier 220 and the second power amplifier 225 in a signal receiving path. Thus, an output value of the third power amplifier 230 may be a common input value of the first power amplifier 220 and the second power amplifier 225.

In one embodiment, an actual power amplifier may amplify and output an input value within a specific section (e.g., a linear region) at a constant ratio (or gain). However, when the input value is out of a specific section, the power amplifier may operate in a saturation region. When the power amplifier operates in a saturation region, the power amplifier may output a constant value regardless of an input value. Alternatively, when the power amplifier operates in a saturation region, a ratio (or gain) of an output value of the power amplifier to an input value may not be constant.

The first attenuator 240 and the second attenuator 245 may be passive elements. For example, the first attenuator 240 and the second attenuator 245 may include variable resistors. The processor 200 may be operatively coupled with the first attenuator 240 and the second attenuator 245. The processor 200 may individually reduce an input value of the first power amplifier 220 or the second power amplifier 225 by operating the first attenuator 240 and the second attenuator 245.

The memory 250 may store various data used by the processor 200 of the electronic device 101. For example, the data may include software (e.g., the program 140 of FIG. 1) and input data or output data for a command related thereto.

According to an embodiment, while the electronic device 101 performs communication, the first power amplifier 220 and the second power amplifier 225 may generate heat. The amplification characteristics of the first power amplifier 220 and the second power amplifier 225 may be changed or deteriorated at a high temperature. Because the amplification performance of the first power amplifier 220 and the second power amplifier 225 is deteriorated due to heat generation, EIRP of a signal transmitted by the electronic device 101 may be deteriorated. The processor 200 may increase a first input value of the first power amplifier 220 and a second input value of the second power amplifier 225 by increasing the output value of the third power amplifier 230 to compensate for the EIRP degradation. In this case, the degraded EIRP may be compensated for, but at least one of the first power amplifier 220 and the second power amplifier 225 may operate in a saturation region. In this case, EVM degradation of the transmission signal may be caused due to the saturated power amplifier. The processor 200 may identify an operating state of a power amplifier (e.g., the first power amplifier 220) operating in a saturation region by using a power meter.

For example, when the actual output value of the power amplifier is degraded by 1 dBm or more than the output value for the same input value when the power amplifier operates in a linear region, the processor 200 may determine that the corresponding power amplifier (e.g., the first power amplifier 220) operates in a saturation region. The processor 200 may reduce the input value of the corresponding power amplifier by operating at least one attenuator (e.g., the first attenuator 240) connected to the corresponding power amplifier (e.g., the first power amplifier 220). The processor 200 may control deterioration of EIRP and EVM by controlling the power amplifier operating in the saturation region to operate in a linear region.

Figure 3:
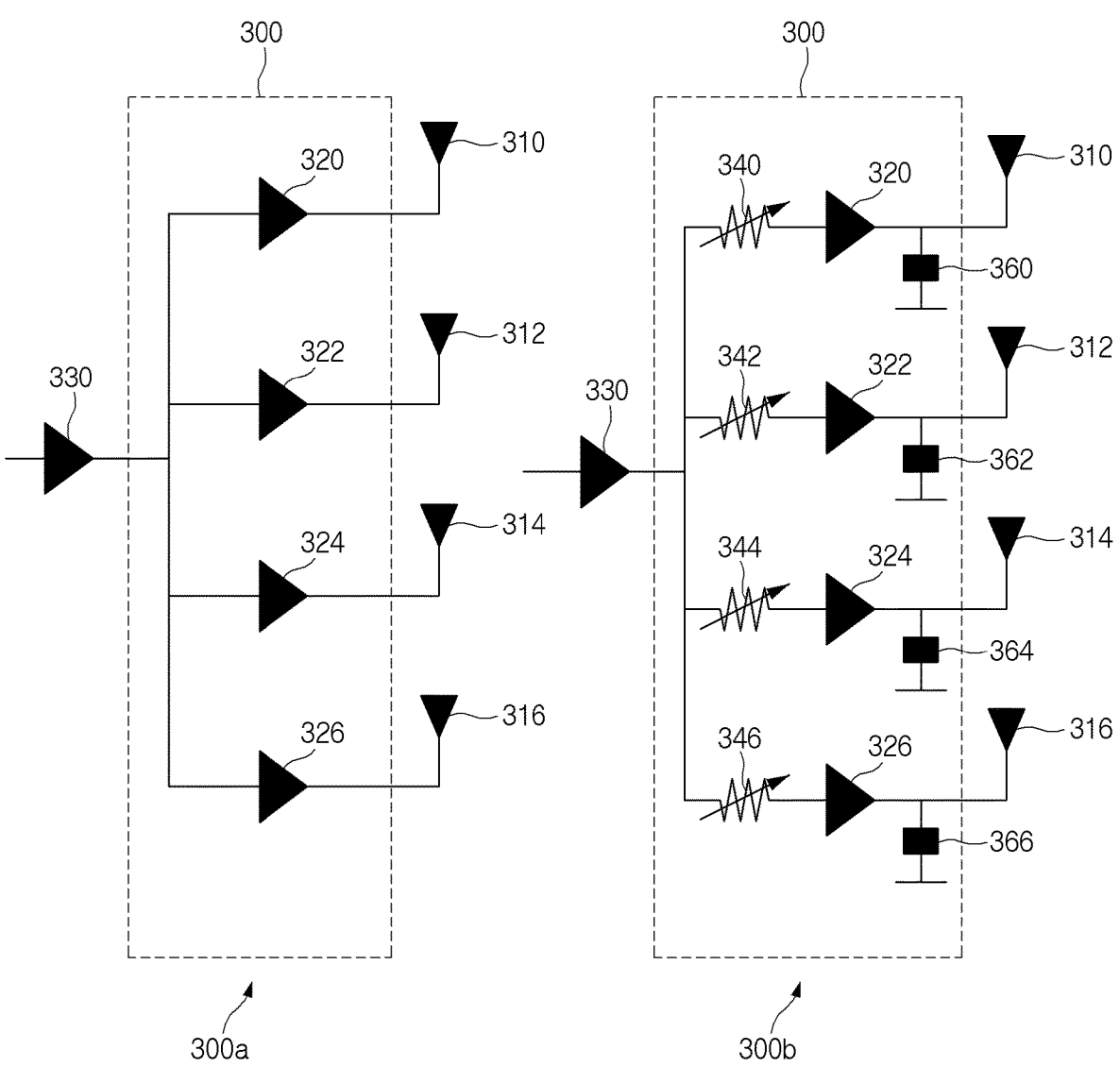
FIG. 3 is a diagram illustrating an electronic device according to an embodiment.

FIG. 3 is a diagram illustrating an electronic device according to an embodiment.

FIG. 3 illustrates a comparison between an electronic device 300*a* (e.g., 101 of FIG. 1) according to a comparative embodiment and an electronic device 300*b* (e.g., 101 of FIG. 1) according to an embodiment. The electronic device 300*b* further includes an attenuator in the configuration of the electronic device 300*a*. The number of antennas, power amplifiers, power meters, and attenuators in FIG. 3 is not limited to the example shown in FIG. 3, and the electronic device 300*a* or 300*b* may include N antennas (where N is a natural number of 2 or more), N power amplifiers, N power meters, and N attenuators that correspond to the antennas, respectively.

The electronic device 300*a* may include an RFIC 300 and/or a plurality of antennas 310, 312, 314, and/or 316 (e.g., the first antenna 310, the second antenna 312, the third antenna 314 and/or the fourth antenna 316). The RFIC 300 includes a plurality of power amplifiers 320, 322, 324, and/or 326 (e.g., the first power amplifier 220 of FIG. 2 and/or the second power amplifier 225 of FIG. 2). For example, the RFIC 300 may include the first power amplifier 320 (e.g., the first power amplifier 220 of FIG. 2) and/or the second power amplifier 322 (e.g., the second power amplifier 225 of FIG. 2). In one embodiment, the RFIC 300 may further include additional components. For example, the RFIC 300 may further include a low noise amplifier (LNA) and/or a filter. When transmitting, the RFIC 300 may convert a signal of an intermediate band into a signal of a high frequency band used in a cellular network (e.g., the second network 199 of FIG. 1) and transmit it to the plurality of antennas 310, 312, 314, and/or 316. A processor (e.g., 200 in FIG. 2) may perform mmWave communication by using the plurality of antennas 310, 312, 314, and/or 316.

According to an embodiment, a third power amplifier 330 (e.g., the third power amplifier 230 of FIG. 2) may be arranged before the plurality of power amplifiers 320, 322, 324, and/or 326. In other words, the third power amplifier 330 may be positioned in front of the plurality of power amplifiers 320, 322, 324, and/or 326 in a signal receiving path. An output value of the third power amplifier 330 may be applied as a common input value of the plurality of power amplifiers 320, 322, 324, and/or 326.

The electronic device 300*b* may further include a plurality of attenuators 340, 342, 344, and/or 346 (e.g., the first attenuator 240 or the second attenuator 245 of FIG. 2), and/or a plurality of power meters 360, 362, 364, and/or 366 in the electronic device 300*a*. For example, the electronic device 300*b* may include the first attenuator 340 and/or the second attenuator 342. The plurality of attenuators 340, 342, 344, and/or 346 may be arranged before the plurality of power amplifiers 320, 322, 324, and/or 326 and included in the RFIC 300. For example, the first attenuator 340 may be arranged before the first power amplifier 320 and the second attenuator 342 may be arranged before the second power amplifier 322. The processor 200 may identify the operating states of the plurality of power amplifiers 320, 322, 324, and/or 326 by using the plurality of power meters 360, 362, 364, and/or 366, and operate the plurality of attenuators 340, 342, 344, and/or 346 based on the identifying result.

According to an embodiment, the plurality of attenuators 340, 342, 344, and/or 346 may include at least one resistor. For example, the first attenuator 340 may include at least one resistor (e.g., a variable resistor), and reduce the intensity of a signal transmitted from the third power amplifier 330 (e.g., the third power amplifier 230 of FIG. 2) without distorting the waveform thereof to transmit the signal to the first power amplifier 320 (e.g., the first power amplifier 220 of FIG. 2).

According to another embodiment, the plurality of power amplifiers 320, 322, 324, and/or 326 may be designed to have individual amplification gains. In this case, the plurality of power amplifiers 320, 322, 324, and/or 326 may be turned on/off according to the respective operating states (e.g., saturation states). When the plurality of power amplifiers 320, 322, 324, and/or 326 have individual amplification gains, the processor 200 may directly control each amplification gain of the plurality of power amplifiers 320, 322, 324, and/or 326 without controlling the attenuator.

A description of EIRP and EVM of signals transmitted by the electronic device 300a and the electronic device 300b may be referenced by the description of FIGS. 4 to 7.

Figure 4:
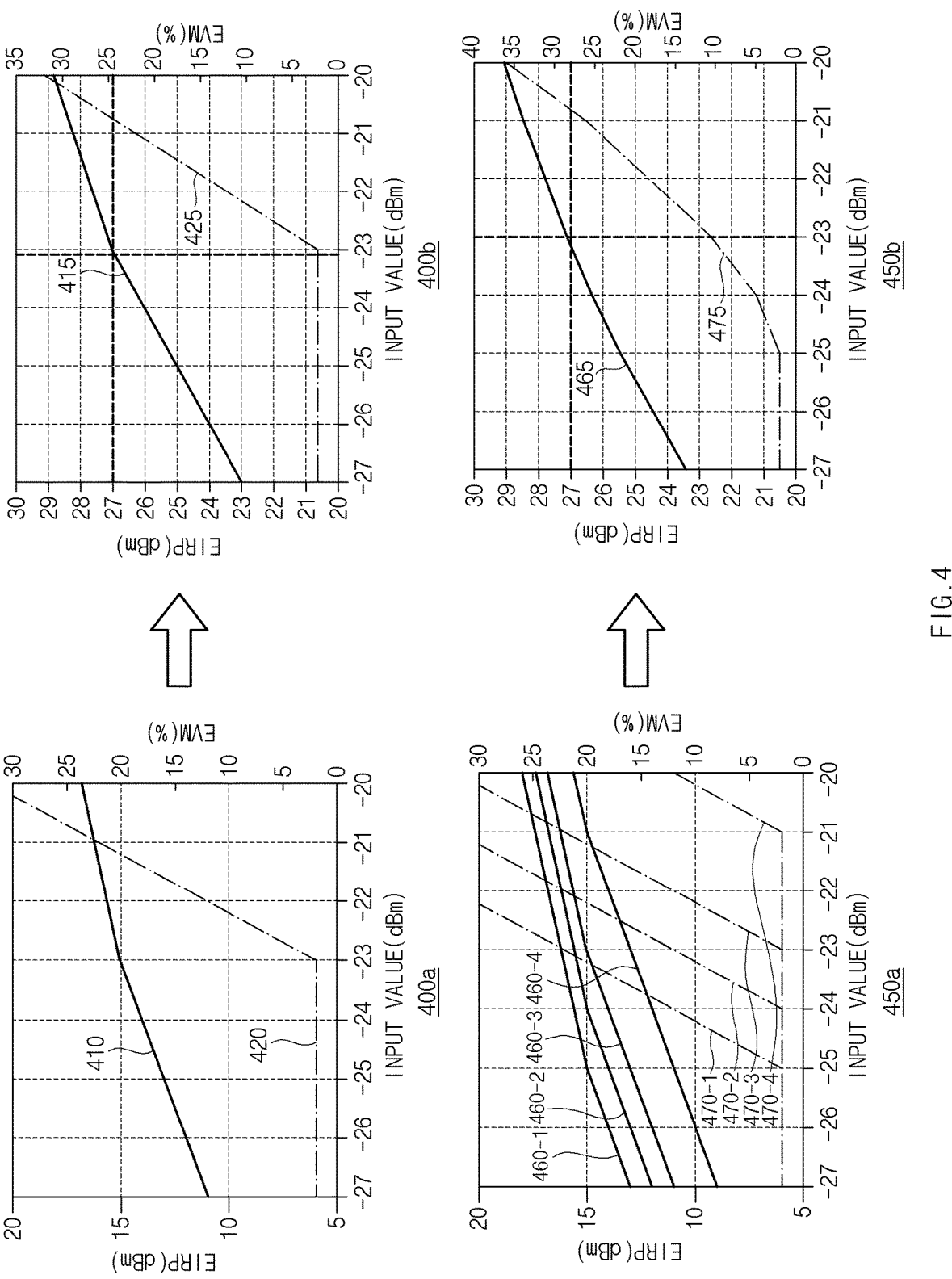
FIG. 4 is a diagram illustrating EIRP and EVM of signals transmitted by an electronic device including an actual power amplifier and an electronic device including an ideal power amplifier.

FIG. 4 is a diagram illustrating EIRP and EVM of signals transmitted by an electronic device including an actual power amplifier and an electronic device including an ideal power amplifier.

The horizontal axis of the graphs of FIG. 4 may be an input value of a plurality of power amplifiers (e.g., the plurality of power amplifiers 320, 322, 324, and 326 of FIG. 3), the left vertical axis is an EIRP value, and the right vertical axis is an EVM value. The input values of the plurality of power amplifiers may be an output value of the third power amplifier 330 of FIG. 3. The EIRP and EVM values of the graphs of FIG. 4 are measured when the temperature of each power amplifier is the same.

Graphs 400a and 400b illustrate EIRP and EVM values when the power amplifier exhibits ideal characteristics. Graphs 450a and 450b illustrate EIRP and EVM values when the power amplifier exhibits actual characteristics. For example, the graphs 450a and 450b may illustrate EIRP and EVM of a signal transmitted by the electronic device 300a of FIG. 3.

Referring to the graph 400a, a plurality of (e.g., four) power amplifiers may have the same characteristics at a specific temperature. Therefore, both EIRP and EVM values of signals transmitted through the antennas (e.g., the first antenna 210 and the second antenna 215 of FIG. 2 and the first antenna 310 and the second antenna 312 of FIG. 3) connected to each power amplifier may be the same. Reference numeral 410 may be referred to as an EIRP value, and reference numeral 420 may be referred to as an EVM value. Reference numerals 410 and 420 are shown as a single line on the graph, but the EIRP and EVM values of each of the plurality of antennas may be overlapped.

Referring to the graph 450a, a plurality of (e.g., four) power amplifiers may have different characteristics at a specific temperature. Therefore, EIRP and EVM values of the signals transmitted through the antennas (e.g., the first antenna 210 and the second antenna 215 of FIG. 2 and the first antenna 310 and the second antenna 312 of FIG. 3) connected to each power amplifier may be different. Reference numerals 460-1, 460-2, 460-3, and 460-4 may be referred to as EIRP values of respective transmission signals, and reference numerals 470-1, 470-2, 470-3, and 470-4 may be referred to as EVM values of respective transmission signals.

The graphs 400b and 450b illustrate EIRP and EVM values of signals transmitted through a plurality of antennas when a plurality of (e.g., four) antennas form a beam. Reference numerals 415 and 465 may be referred to as EIRP values and reference numerals 425 and 475 may be referred to as EVM values.

Referring to the graph 400b, an electronic device (e.g., 101 in FIG. 1) including a plurality of ideal power amplifiers may apply an input of about −23.2 dBm to the plurality of power amplifiers to maintain a specified EIRP (e.g., 27 dBm). When about −23.2 dBm is applied to the plurality of power amplifiers, the EVM value of the signal transmitted by the electronic device 101 may be referred to as about 3%.

Referring to the graph 450b, in order to maintain a specified EIRP (e.g., 27 dBm), an electronic device (e.g., 300a in FIG. 3) including a plurality of actual power amplifiers may apply about −23 dBm as an input. When about −23 dBm is applied to the plurality of power amplifiers, the EVM value of the signal transmitted by the electronic device 300a may be referred to as about 10%.

According to FIG. 4, the input values of the plurality of ideal power amplifiers should be lower in order to maintain the same EIRP value, but this is exemplary and the input values of the actual power amplifiers according to the characteristics of the actual power amplifiers may be lower than that in the ideal case.

Figure 5:
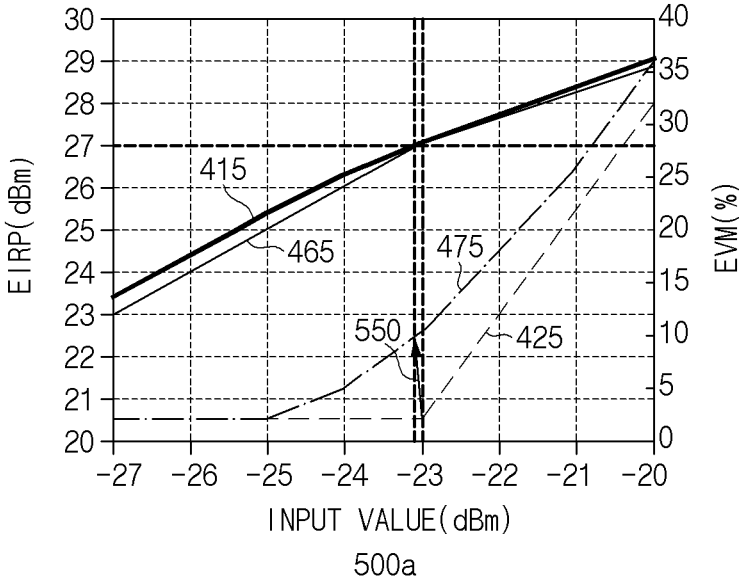
FIG. 5 is a view illustrating comparison between EIRP and EVM values of signals transmitted by an electronic device including an actual power amplifier and an electronic device including an ideal power amplifier.

FIG. 5 is a view illustrating comparison between EIRP and EVM values of signals transmitted by an electronic device including an actual power amplifier and an electronic device including an ideal power amplifier.

The graph 500a of FIG. 5 illustrates the overlapping of the graph 400b and the graph 450b of FIG. 4. Among the reference numerals in FIG. 5, a description of the same as the reference numeral in FIG. 4 may be referred to by the description of FIG. 4.

According to an embodiment, in order to maintain an EIRP value of 27 dBm, an electronic device (e.g., 101 in FIG. 1) including a plurality of ideal power amplifiers may apply about −23.2 dBm as an input to the plurality of power amplifiers. According to an embodiment, in order to maintain an EIRP value of 27 dBm, an electronic device (e.g., 300a in FIG. 3) including a plurality of actual power amplifiers may apply about −23 dBm as an input to the plurality of power amplifiers. As an EVM value of a signal transmitted by an electronic device including a plurality of ideal power amplifiers may be about 3%, an EVM value of a signal transmitted by an electronic device including a plurality of actual power amplifiers may be referred to as about 10%. That is, the EVM value of a signal transmitted by an electronic device (e.g., 300a of FIG. 3) according to the comparative embodiment may be degraded by the degree indicated by reference numeral 550 compared to an ideal case. The EVM may be deteriorated because at least one of the plurality of power amplifiers operates in a saturation region when about −23 dBm is applied to the plurality of power amplifiers as an input.

In order to compensate for such EVM degradation, an electronic device (e.g., 300b in FIG. 3) according to an embodiment may further include a plurality of attenuators. A method of compensating for EVM degradation using a plurality of attenuators may be referenced by the description of FIG. 6.

FIG. 6 is a flowchart illustrating an operation of an electronic device according to an embodiment.

Operations 600 to 630 may be performed by an electronic device (e.g., 300b of FIG. 3) including a plurality of attenuators (e.g., the first attenuator 240 and the second attenuator 245 of FIG. 2 and the first attenuator 340 and the second attenuator 342 of FIG. 3). Operations of the electronic device 300b may be substantially performed by a processor (e.g., 200 of FIG. 2).

Referring to operation 600, a processor (e.g., 200 in FIG. 2) may perform beamforming (e.g., generate a beamforming signal) by using a first antenna (e.g., 210 in FIG. 2) and a second antenna (e.g., 215 in FIG. 2). The number of antennas is exemplary, and the electronic device 300*b* may further include at least one antenna.

In operation 610, when performance of a beamforming signal is deteriorated, the processor 200 may increase a first input value of a first power amplifier (e.g., 220 of FIG. 2 and the first power amplifier 320 of FIG. 3) and a second input value of a second power amplifier (e.g., 220 of FIG. 2 and the second power amplifier 322 of FIG. 3). According to an embodiment, the processor 200 may determine whether the performance of the beamforming signal is deteriorated based on the EIRP value of the signal transmitted by the electronic device 300*b*. The processor 200 may increase the first input value of the first power amplifier 220 and/or the second input value of the second power amplifier 225 to compensate for the degraded EIRP. The first power amplifier 220 and the second power amplifier 225 may use the output value of the third power amplifier (e.g., 230 in FIG. 2, and the power amplifier 330 in FIG. 3) as a common input. In other words, the processor 200 may increase the output value of the third power amplifier 230.

According to an embodiment, the processor 200 may check the strength of a feedback signal of a path connected to each of the plurality of antennas (e.g., the plurality of antennas 310, 312, 314, and/or 316 of FIG. 3), and determine whether the signal performance of a corresponding path is degraded. For example, a path connected to the first antenna 310 (e.g., 310 in FIG. 2) may include the first power amplifier 320 (e.g., the first power amplifier 320 and the first attenuator 340 in FIG. 3), and the first attenuator 340 (e.g., the first attenuator 340 in FIG. 3).

In operation 620, the processor 200 may measure a first output value of the first power amplifier 220 with respect to the increased first input value, and measure a second output value of the second power amplifier 225 with respect to the increased second input value.

In operation 630, when the performance of at least one of the first power amplifier 220 or the second power amplifier 225 is deteriorated based on the measurement result (in operation 620), the processor 200 may operate at least one of the first attenuator (e.g., 240 of FIG. 2) or the second attenuator (e.g., 245 of FIG. 2) to be electrically connected to the deteriorated power amplifier. For example, the processor 200 may compare the first output value of the first power amplifier 220 and the second output value of the second power amplifier 225 with the output values for the increased first input value of the first power amplifier 220 and the increased second input value of the second power amplifier 225 in the linear region. For example, the processor 200 may determine that the performance of at least one of the first power amplifier 220 or the second power amplifier 225 is deteriorated when the difference between the output values is greater than or equal to a first threshold value (e.g., 1 dBm). The deteriorated power amplifier may operate in the saturation region.

When the performance of at least one of the first power amplifier 220 or the second power amplifier 225 deteriorates, the EVM of a signal transmitted by the electronic device 101 may deteriorate. The processor 200 may reduce the input value of the power amplifier by operating an attenuator (e.g., the first attenuator 240 and/or the second attenuator 245) to compensate for the deteriorated EVM. The attenuator (e.g., the first attenuator 240 or the second attenuator 245) may be electrically connected to the deteriorated power amplifier. By individually reducing only the input value of the power amplifier whose performance is deteriorated, the processor 200 may maintain the entire EIRP value, and the deteriorated power amplifier may again operate in the linear region.

In operations 600 to 630, the processor 200 may compensate for the deteriorated EIRP and alleviate the deterioration of the EVM.

Figure 7:
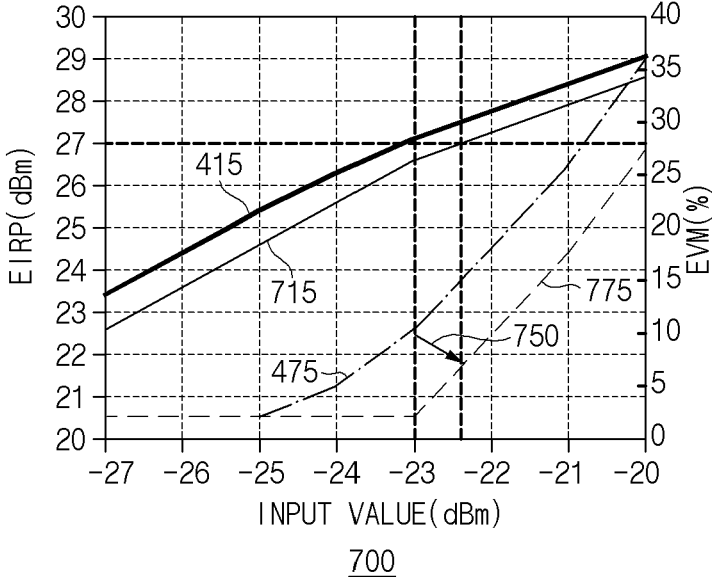
FIG. 7 is a diagram illustrating a comparison of EIRP and EVM values of signals transmitted by an electronic device according to an embodiment.

FIG. 7 is a diagram illustrating a comparison of EIRP and EVM values of signals transmitted by an electronic device according to an embodiment.

Reference numerals 415 and 475 may indicate EIRP and EVM values of signals transmitted by the electronic device 300*a* of FIG. 3. Reference numeral 715 and reference numeral 775 may indicate EIRP and EVM values of signals transmitted by the electronic device 300*b* of FIG. 3. Reference numerals 415 and 715 may be referred to as EIRP values, and reference numerals 475 and 775 may be referred to as EVM values.

According to an embodiment, the electronic device 300*b* may apply about −22.4 dBm as an input to a plurality of power amplifiers in order to maintain a specified EIRP (e.g., 27 dBm). When about −22.4 dBm is applied to the plurality of power amplifiers, the EVM value of the signal transmitted by the electronic device 300*b* may be referred to as about 6%. That is, the EVM value of the signal transmitted by the electronic device (e.g., 300*b* in FIG. 3) may be compared with the EVM of the signal transmitted by the electronic device 300*a*, and the EVM degradation is compensated for by the degree indicated by reference numeral 750. A description of the EVM compensation method of the electronic device 300*b* may be referenced by the description of FIG. 6. Because the electronic device 300*b* individually controls the power amplifiers or controls the attenuator electrically connected to each power amplifier to alleviate the EVM degradation and maintain the same EIRP of the transmission signal, the electronic device 300*b* may transmit a higher quality signal than the electronic device 300*a*.

Figure 8:
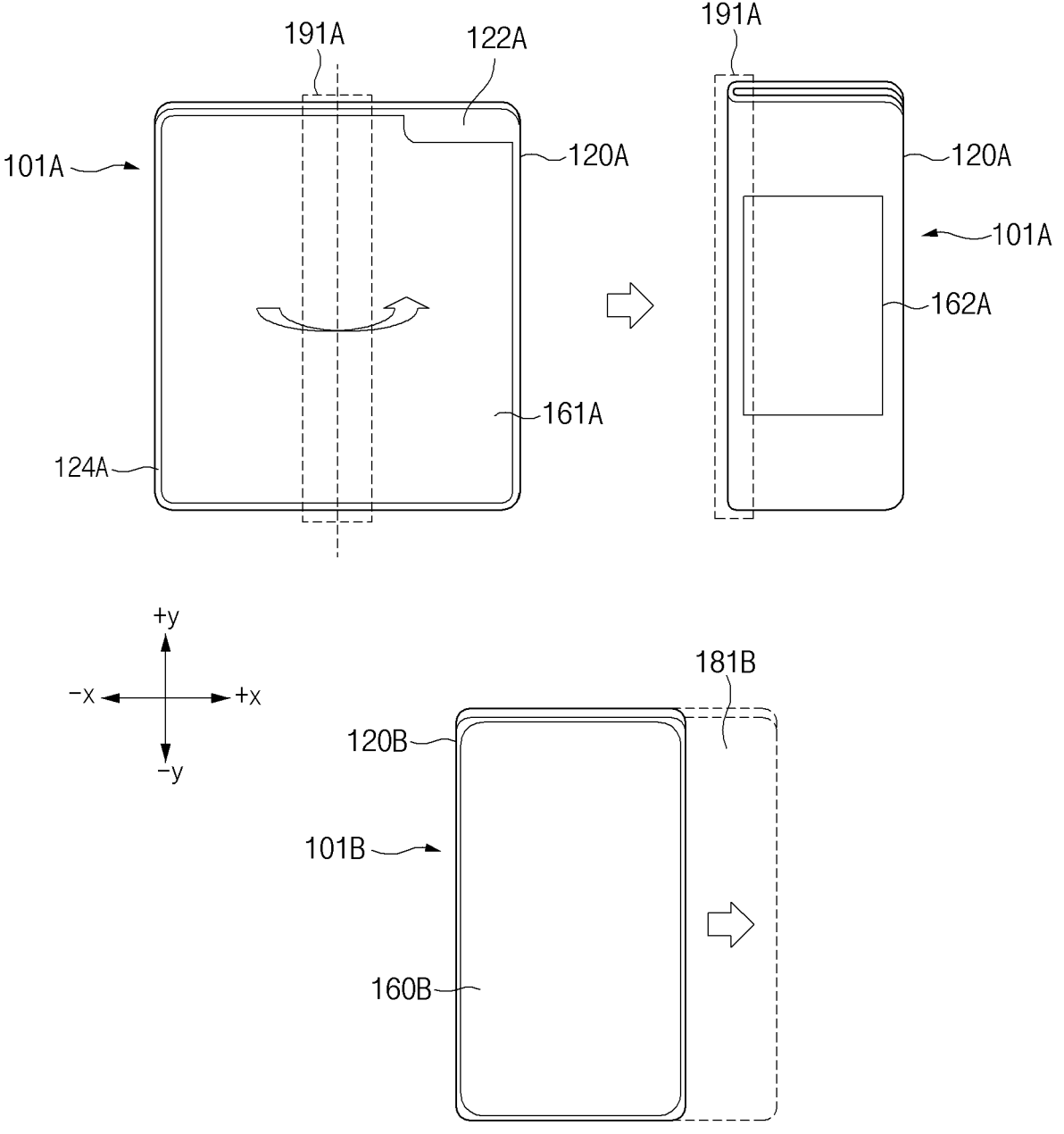
FIG. 8 is a diagram illustrating electronic devices whose shapes change according to one or more embodiments.

FIG. 8 is a diagram illustrating electronic devices whose shapes change according to one or more embodiments.

A first electronic device 101A and a second electronic device 101B may include the configuration of FIG. 2. The first electronic device 101A and the second electronic device 101B may perform operations of FIG. 6 when the EIRP of the transmission signal is deteriorated.

According to an embodiment, the shape of the first electronic device 101A (e.g., the electronic device 101 of FIG. 1) may be physically changed according to folding/unfolding. For example, the first electronic device 101A may include a flexible display on at least a portion thereof. The electronic device may be folded (e.g., closed) or unfolded (e.g., open) around a foldable portion of the electronic device. For example, the foldable portion of an electronic device may be referred to as a hinge portion. The foldable portion refers to a portion (e.g., a hinge) or a region in which the shape of the electronic device is changeable, and is not limited to a specific structure.

According to an embodiment, the first electronic device 101A may be folded left and right. In FIG. 8, a left direction may be referred to as a −x axis direction and a right direction may be referred to as a +x axis direction. For example, the first electronic device 101A may be folded around at least one foldable portion 191A. For example, the first electronic device 101A may include a (flexible) first display 161A (e.g., the display module 160 of FIG. 1). The first electronic device 101A may be folded or unfolded around the foldable portion 191A. The first electronic device 101A may include a second display 162A (e.g., the display module 160 of FIG. 1) arranged on another surface opposite to one surface on which the first display 161A is arranged. In FIG. 8, the first electronic device 101A is illustrated as being an in-fold electronic device that is folded with the first display 161A inside, but the embodiments of the present document are not limited thereto. For example, the first electronic device 101A may be an out-fold electronic device that is folded with the first display 161A facing out or an electronic device that supports both in-fold and out-fold. As another example, the first display 161A is shown as one display, but the embodiments are not limited thereto. The first electronic device 101A may include a plurality of displays divided based on the foldable portion 191A. The housing 120A may also include a plurality of housings (e.g., a first housing 122A and a second housing 124A) divided based on the housing 120A or the foldable portion 191A. As still another example, the first electronic device 101A may be a combination of a plurality of electronic devices coupled to be folded around the foldable portion 191A. In this case, the plurality of electronic devices may be coupled to each other by a separate structure (e.g., a housing or a hinge).

According to an embodiment, the first electronic device 101A (e.g., the electronic device 300b of FIG. 3) may apply a constant input value to a plurality of power amplifiers (e.g., the first power amplifier 220 or the second power amplifier 225 of FIG. 2) to maintain a specified EIRP (e.g., 27 dBm) in a folded state. When the first electronic device 101A is unfolded around at least one foldable portion 191A and is in an unfolded state, because the arrangement of a plurality of antennas (e.g., the first antenna 210 and the second antenna 215 of FIG. 2) is changed, the first electronic device 101A may adjust an input value applied to the plurality of power amplifiers in order to maintain a specified EIRP (e.g., 27 dBm). For example, when an input value applied to a plurality of power amplifiers is changed, at least one of the plurality of power amplifiers may operate in a saturation region. The first electronic device 101A may operate an attenuator (e.g., the first attenuator 240 or the second attenuator 245 of FIG. 2) to reduce the input value of a corresponding power amplifier. An attenuator (e.g., the first attenuator 240 or the second attenuator 245 of FIG. 2) may be electrically connected to a power amplifier operating in a saturation region. The above-described operation of the first electronic device 101A may be performed in the same manner even when the first electronic device 101A is folded.

According to an embodiment, the shape of the second electronic device 101B (e.g., the electronic device 101 of FIG. 1) may be physically changed according to the extending/retracting of the housing of the electronic device. For example, the electronic device may include a housing and/or a display (e.g., the display module 160 of FIG. 1) of which at least a portion may be extended. For example, a portion of the electronic device may be slid or rolled to extend (e.g., open) or contract (e.g., close) the electronic device. An extension portion refers to a portion or region corresponding to a difference between a first shape and a second shape when the shape of the electronic device is changed from the first shape to the second shape, and is not limited to a specific structure.

According to an embodiment, the second electronic device 101B (e.g., the electronic device 101 of FIG. 1) may include an extension portion 181B that extends/contracts left and right. For example, at least a portion of the housing 120B of the second electronic device 101B may include the extension portion 181B extending in a rightward direction of the second electronic device 101B. For example, the extension portion 181B may move independently of the display 160B (e.g., the display module 160 of FIG. 1). In this case, a portion of the housing 120B may move to one side of the extension portion 181B relative to the display 160B. As another example, the extension portion 181B may move together with the display 160B. In this case, the display 160B may extend as the extension portion 181B moves to one side of the housing 120B together with the display 160B.

According to an embodiment, the second electronic device 101B (e.g., the electronic device 300b of FIG. 3) may apply a constant input value to a plurality of power amplifiers (e.g., the first power amplifier 220 or the second power amplifier 225 of FIG. 2) to maintain a specified EIRP (e.g., 27 dBm) in a contracted state. Because the arrangement of the plurality of antennas (e.g., the first antenna 210 and the second antenna 215 in FIG. 2) is changed when a portion of the second electronic device 101B slides and the second electronic device 101B is in an extended state, the second electronic device 101B may adjust the input value applied to the plurality of power amplifiers in order to maintain the specified EIRP (e.g., 27 dBm). For example, when the input value applied to the plurality of power amplifiers is changed, at least one of the plurality of power amplifiers may operate in a saturation region. The second electronic device 101B may reduce the input value of a corresponding power amplifier by operating an attenuator (e.g., the first attenuator 240 or the second attenuator 245 of FIG. 2). The attenuator (e.g., the first attenuator 240 or the second attenuator 245 of FIG. 2) may be electrically connected to a power amplifier operating in a saturation region. The above-described operation of the second electronic device 101B may be performed in the same manner even when the second electronic device 101B is contracted.

According to an embodiment, the first electronic device 101A and/or the second electronic device 101B may further include at least one sensor (e.g., the sensor module 176 of FIG. 1). The first electronic device 101A and/or the second electronic device 101B may detect a shape change by using at least one sensor. The first electronic device 101A and/or the second electronic device 101B may individually control a plurality of power amplifiers to compensate for EIRP degradation due to a shape change and mitigate the EVM degradation. Such shape changes are exemplary, and the embodiments are not limited thereto.

What is claimed is:

1. An electronic device comprising:

a first antenna;

a second antenna;

a first power amplifier electrically connected to the first antenna;

a second power amplifier electrically connected to the second antenna;

a first attenuator electrically connected to the first power amplifier;

a second attenuator electrically connected to the second power amplifier; and a third power amplifier electrically connected the first attenuator and the second attenuator;

a processor operatively connected to the first power amplifier, the second power amplifier, the third power amplifier, the first attenuator and the second attenuator, wherein the processor is configured to:

apply an output value of the third power amplifier as a first input value of the first power amplifier and a second input value of the second power amplifier, generate a beamforming signal by using the first antenna and the second antenna, increase the first input value of the first power amplifier and the second input value of the second power amplifier, based on performance of the beamforming signal, measure a first output value of the first power amplifier with respect to the increased first input value and measure a second output value of the second power amplifier with respect to the increased second input value, determine whether the first power amplifier operates in a first saturation region based on the measured first output value, determine whether the second power amplifier operates in a second saturation region based on the measured second output value, based on determining that the first power amplifier operates in the first saturation region, operate the first attenuator, and based on determining that the second power amplifier operates in the second saturation region, operate the second attenuator, wherein the first input value and the second input value are identical.

2. The electronic device of claim 1, wherein the processor is further configured to check the performance of the beamforming signal based on an equivalent isotropic radiated power (ETRP) value.

3. The electronic device of claim 1, wherein the processor is further configured to:

compare the first output value of the first power amplifier with another output value in a linear region of the increased first input value of the first power amplifier; and determine that performance of the first power amplifier is deteriorated based on a difference between the first output value of the first power amplifier and the another output value in the linear region for the increased first input value of the first power amplifier being equal to or greater than a first threshold value.

4. The electronic device of claim 1, wherein the first attenuator comprises a first variable resistance and the second attenuator comprises a second variable resistance.

5. The electronic device of claim 4, wherein the processor is further configured to:

based on determining that the first power amplifier has deteriorated performance, reduce the first input value of the first power amplifier by operating the first attenuator, and based on determining that the second power amplifier has deteriorated performance, reduce the second input value of the second power amplifier by operating the second attenuator.

6. The electronic device of claim 1, wherein the first power amplifier and the second power amplifier have different performances at a specific temperature.

7. The electronic device of claim 1, further comprising:

a foldable housing that is foldable along at least one axis; and at least one sensor, wherein the processor is further configured to:

detect folding or unfolding of the foldable housing of the electronic device by using the at least one sensor, and increase the first input value of the first power amplifier and the second input value of the second power amplifier based on the performance of the beamforming signal being deteriorated in a folded state or an unfolded state.

8. The electronic device of claim 1, further comprising:

a rollable housing having at least one surface extendable; and at least one sensor, wherein the processor is further configured to:

detect extension or contraction of the rollable housing of the electronic device by using the at least one sensor, and increase the first input value of the first power amplifier and the second input value of the second power amplifier based on the performance of the beamforming signal being deteriorated in a contracted state or an extended state.

9. A method performed by an electronic device, the method comprising:

applying an output value of a third power amplifier as a first input value of a first power amplifier and a second input value of a second power amplifier;

generating a beamforming signal by using a first antenna and a second antenna;

increasing the first input value of the first power amplifier and the second input value of the second power amplifier, based on performance the beamforming signal;

measuring a first output value of the first power amplifier with respect to the increased first input value and measuring a second output value of the second power amplifier with respect to the increased second input value;

determining whether the first power amplifier operates in a first saturation region based on the measured first output value;

determining whether the second power amplifier operates in a second saturation region based on the measured second output value;

based on determining that the first power amplifier operates in the first saturation region operating a first attenuator; and based on determining that the second power amplifier operates in the second saturation region, operating a second attenuator, wherein the first input value and the second input value are identical.

10. The method of claim 9, further comprising checking the performance of the beamforming signal based on an equivalent isotropic radiated power (EIRP) value.

11. The method of claim 9, further comprising:

comparing the first output value of the first power amplifier with another output value in a linear region of the increased first input value of the first power amplifier; and determining that performance of the first power amplifier is deteriorated based on a difference between the first output value of the first power amplifier and the another output value in the linear region for the increased first input value of the first power amplifier being equal to or greater than a first threshold value.

12. The method of claim 9, wherein the first attenuator comprise a first variable resistance and the second attenuator comprise a second variable resistance.

13. The method of claim 9, further comprising:

based on determining that the first power amplifier has deteriorated performance, reducing the first input value of the first power amplifier by operating the first attenuator, and based on determining that the second power amplifier has deteriorated performance, reducing the second input value of the second power amplifier by operating the second attenuator.

14. The method of claim 9, wherein the first power amplifier and the second power amplifier have different performances at a specific temperature.

15. The method of claim 9, further comprising:

detecting folding or unfolding of a foldable housing of the electronic device by using at least one sensor, and increasing the first input value of the first power amplifier and the second input value of the second power amplifier based on the performance of the beamforming signal being deteriorated in a folded state or an unfolded state.

16. The method of claim 9, further comprising:

detecting extension or contraction of a rollable housing of the electronic device by using at least one sensor, and increasing the first input value of the first power amplifier and the second input value of the second power amplifier based on the performance of the beamforming signal being deteriorated in a contracted state or an extended state.

17. A non-transitory storage medium storing one or more programs which are executed by one or more processors of an electronic device, to perform a method comprising:

applying an output value of a third power amplifier as a first input value of a first power amplifier and a second input value of a second power amplifier;

generating a beamforming signal by using a first antenna and a second antenna;

increasing the first input value of the first power amplifier and the second input value of the second power amplifier, based on performance the beamforming signal;

measuring a first output value of the first power amplifier with respect to the increased first input value and measuring a second output value of the second power amplifier with respect to the increased second input value;

determining whether the first power amplifier operates in a first saturation region based on the measured first output value;

determining whether the second power amplifier operates in a second saturation region based on the measured second output value;

based on determining that the first power amplifier operates in the first saturation region operating a first attenuator; and based on determining that the second power amplifier operates in the second saturation region operating a second attenuator, wherein the first input value and the second input value are identical.

18. The non-transitory computer-readable storage medium of claim 17, wherein the method further comprises:

checking the performance of the beamforming signal based on an equivalent isotropic radiated power (ETRP) value.

* * * * *